United States Patent
Koide et al.

(10) Patent No.: US 8,446,020 B2
(45) Date of Patent: May 21, 2013

(54) MULTI-CHIP MODULE

(75) Inventors: Masateru Koide, Kawasaki (JP); Daisuke Mizutani, Kawasaki (JP); Aiichiro Inoue, Kawasaki (JP); Hideo Yamashita, Kawasaki (JP); Iwao Yamazaki, Kawasaki (JP); Masayuki Kato, Kawasaki (JP); Seiji Ueno, Yokohama (JP); Kazuyuki Imamura, Yokohama (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 264 days.

(21) Appl. No.: 12/902,527

(22) Filed: Oct. 12, 2010

(65) Prior Publication Data

US 2011/0089579 A1    Apr. 21, 2011

(30) Foreign Application Priority Data

Oct. 16, 2009  (JP) ................. 2009-239489

(51) Int. Cl.
*H01L 23/48* (2006.01)
(52) U.S. Cl.
USPC ........................................................ 257/786
(58) Field of Classification Search
USPC ........................................................ 257/786
See application file for complete search history.

(56) References Cited

U.S. PATENT DOCUMENTS

| | | | |
|---|---|---|---|
| 2004/0115919 A1 | 6/2004 | Takaoka | |
| 2007/0080438 A1* | 4/2007 | Yamanaka et al. | 257/676 |
| 2008/0164622 A1* | 7/2008 | Hayashi | 257/786 |
| 2009/0178275 A1 | 7/2009 | Dang et al. | |

FOREIGN PATENT DOCUMENTS

| | | |
|---|---|---|
| DE | 4222402 A1 | 1/1994 |
| JP | 06-283661 | 10/1994 |
| JP | 10-012809 A | 1/1998 |
| JP | 2001-094033 | 4/2001 |
| JP | 2002-343924 A | 11/2002 |

OTHER PUBLICATIONS

German Office Action application No. 102010047609.9 dated Nov. 17, 2011.
Notification of Reasons for Refusal dated Feb. 26, 2013 corresponding to Japanese Patent Application No. 2009-239489 and English translation thereof.

\* cited by examiner

*Primary Examiner* — Long K Tran
(74) *Attorney, Agent, or Firm* — Squire Sanders (US) LLP

(57) ABSTRACT

A multi-chip module includes: a board; a wiring board disposed on the board and including a wiring pattern; and a plurality of chips disposed on the wiring board. Each of the plurality of chips is connected with at least one of the other chips, and the plurality of chips and the board are electrically connected with each other via a portion other than the wiring pattern of the wiring board.

8 Claims, 6 Drawing Sheets

MULTI-CHIP MODULE

CROSS-REFERENCE TO RELATED APPLICATIONS

This application is based upon and claims the benefit of priority of the prior Japanese Patent Application No. 2009-239489, filed on Oct. 16, 2009, the entire contents of which are incorporated herein by reference.

FIELD

Embodiments discussed herein are related to a multi-chip module.

BACKGROUND

There is known a semiconductor chip module called multi-chip module (MCM). In a conventional multi-chip module, multiple silicon chips which have been manufactured by separate processes are horizontally packaged onto a unifying substrate. Bare silicon chips are exposed, and are respectively connected with each other through a wiring formed on a ceramic or a build-up board (See for example Japanese Unexamined Patent Publication No. 6-283661).

However, in order to secure a substantial channel area in response to the wiring specification of the ceramic or the build-up board in JP-A-6-283661, a clearance between adjacent chips has to be large.

Additionally, since the large clearance between the chips elongates a wiring length between the chips, it may be difficult to transmit data at high rates between the chips such as large-scale integration (LSI) chips. Further, when the wiring length is elongated, the driver installed in the LSI has to be changed into another lager driver, and the size of the LSI may be accordingly larger. Furthermore, the provision of a large number of channels in the board is limited by the wiring specification.

On the other hand, recently, there has been developed a board having fine wirings such as a build-up board (See for example Japanese Unexamined Patent Publication No. 2001-94033). However, to manufacture the build-up board, a specific process or equipment is additionally needed. Thus, its cost may be increased.

SUMMARY

According to an aspect of the embodiments, a multi-chip module includes: a board; a wiring board disposed on the board and including a wiring pattern; and a plurality of chips disposed on the wiring board. Each of the plurality of chips is connected with at least one of the other chips, and the plurality of chips and the board are electrically connected with each other via a portion other than the wiring pattern of the wiring board.

DESCRIPTION OF EMBODIMENTS

Figure 1:
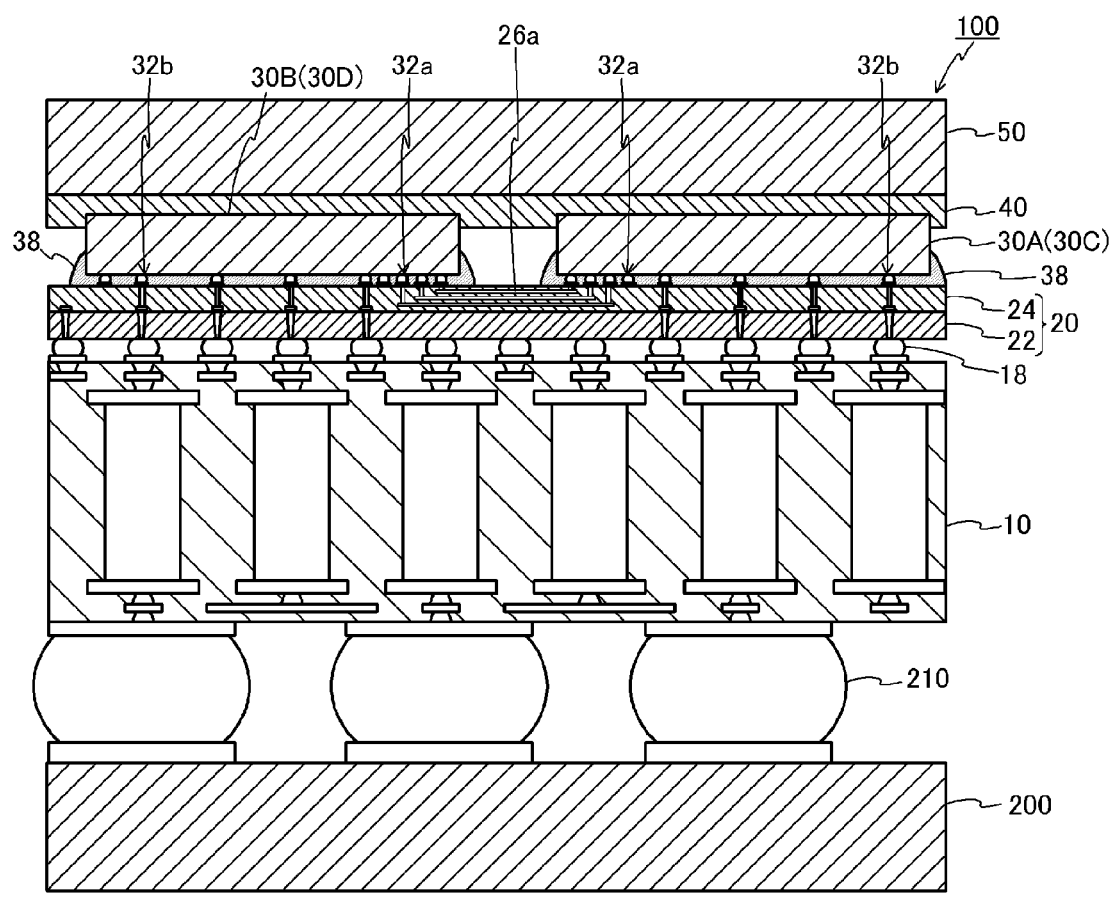
FIG. 1 is an cross sectional view of schematically illustrating a multi-chip module according to an embodiment.

The following description will be given of a multi-chip module and a method of manufacturing the multi-chip module according to an embodiment, with reference to FIGS. 1 to 4. FIG. 1 is a cross sectional view of schematically illustrating a multi-chip module 100 according to an embodiment. The multi-chip module 100 is secured on a motherboard 200 through solder bumps 210, as illustrated in FIG. 1.

Figure 3:
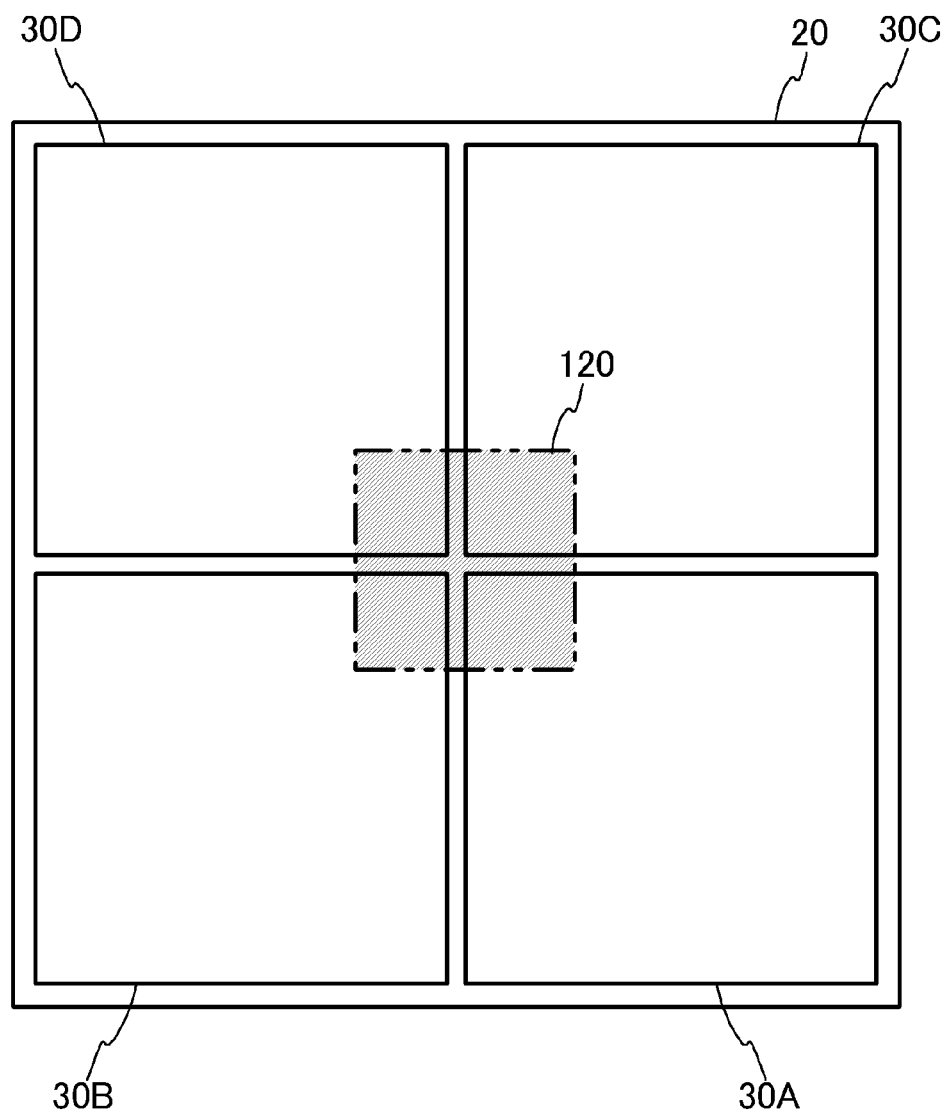
FIG. 3 is a plan view of an arrangement of LSI chips.

The multi-chip module 100 includes: a base board 10; a silicon interposer 20; four LSI chips 30A to 30D; and a heat spreader 50. The LSI chips 30C and 30D are illustrated in FIG. 3.

The base board 10 is called as build-up board. The base board 10 is a multilayer board including: a board having wiring layers and called core board; and wiring layers formed on front and rear surfaces of the board. Examples of the material of the board may be an epoxy resin, polyimide, or ceramic. An example of the material of the wiring is copper.

Figure 2:
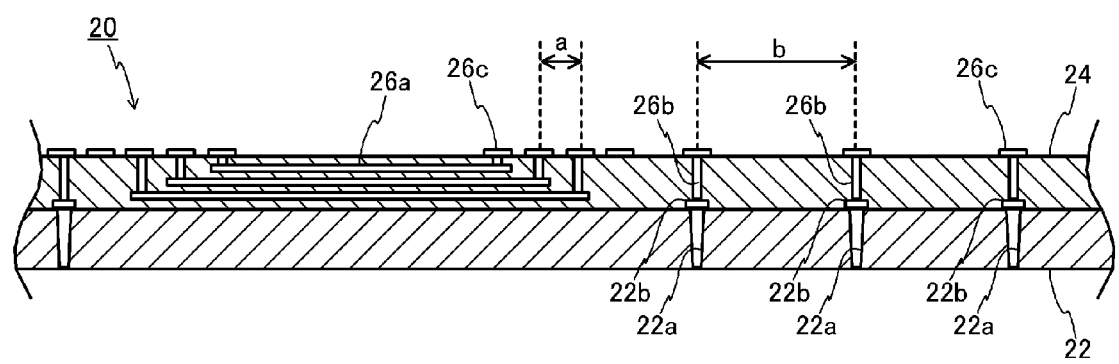
FIG. 2 is a partially enlarged view of a silicon interposer.

The silicon interposer 20 includes: a board 22; and a wiring layer 24 disposed on the board 22. FIG. 2 is a partially enlarged view of a silicon interposer. As illustrated in FIG. 2, plural via holes 22a are provided to penetrate through the board 22 in the vertical direction. The via holes 22a are filled with metals such as coppers by plating. Lands 22b are provided to respectively cover the via holes 22a in the board 22. The wiring layer 24 includes an insulating layer layered on the board 22. Wiring patterns 26a and via holes 26b are formed in the insulting layer by semiconductor manufacture equipment such as a semiconductor exposure apparatus. For example, a clearance a between the wiring patterns 26a is a fine pitch equal to or less than 50 mm. For example, a clearance b between the via holes 26b is from about 150 mm to about 200 mm. This via hole 26b is plated and filled with a metal such as copper. On the upper surface of the wiring layer 24, lands 26c are formed to cover the wiring patterns 26a and the via holes 26b, respectively.

The above mentioned silicon interposer 20 is secured on the upper surface of the base board 10 via solder bumps 18. The bump 18 electrically connects the via hole 22a and the base board 10.

FIG. 3 illustrates a positional relationship between the LSI chips 30A to 30D. Each of the LSI chips 30A to 30D includes a silicon wafer and a circuit pattern formed on the silicon water. As illustrated in FIG. 3, the LSI chips 30A to 30D are closely disposed in a matrix manner on the silicon interposer 20. Herein, the above mentioned wiring patterns 26a of the silicon interposer 20 are provided within a hatching area illustrated in FIG. 3. For example, the size of the hatching area 120 is a square with 10 mm by 10 mm.

As illustrated in FIG. 1, on the lower surfaces of the LSI chips 30A to 30D, first pads 32a are disposed with a high density and second pads 32b are disposed with a low density lower than that of the first pads 32a. The first pad 32a is electrically connected with the wiring patterns 26a via the solder bump. On the other hand, second pad 32b is electrically connected, via the solder bump, with portions other than the wiring patterns 26a, that is, with the lands 26c and the via holes 26b.

That is, the base board 10 and the LSI chips 30A to 30D are electrically connected with each other via the silicon interposer 20 (the portions other than the wiring patterns 26a).

Figure 4:
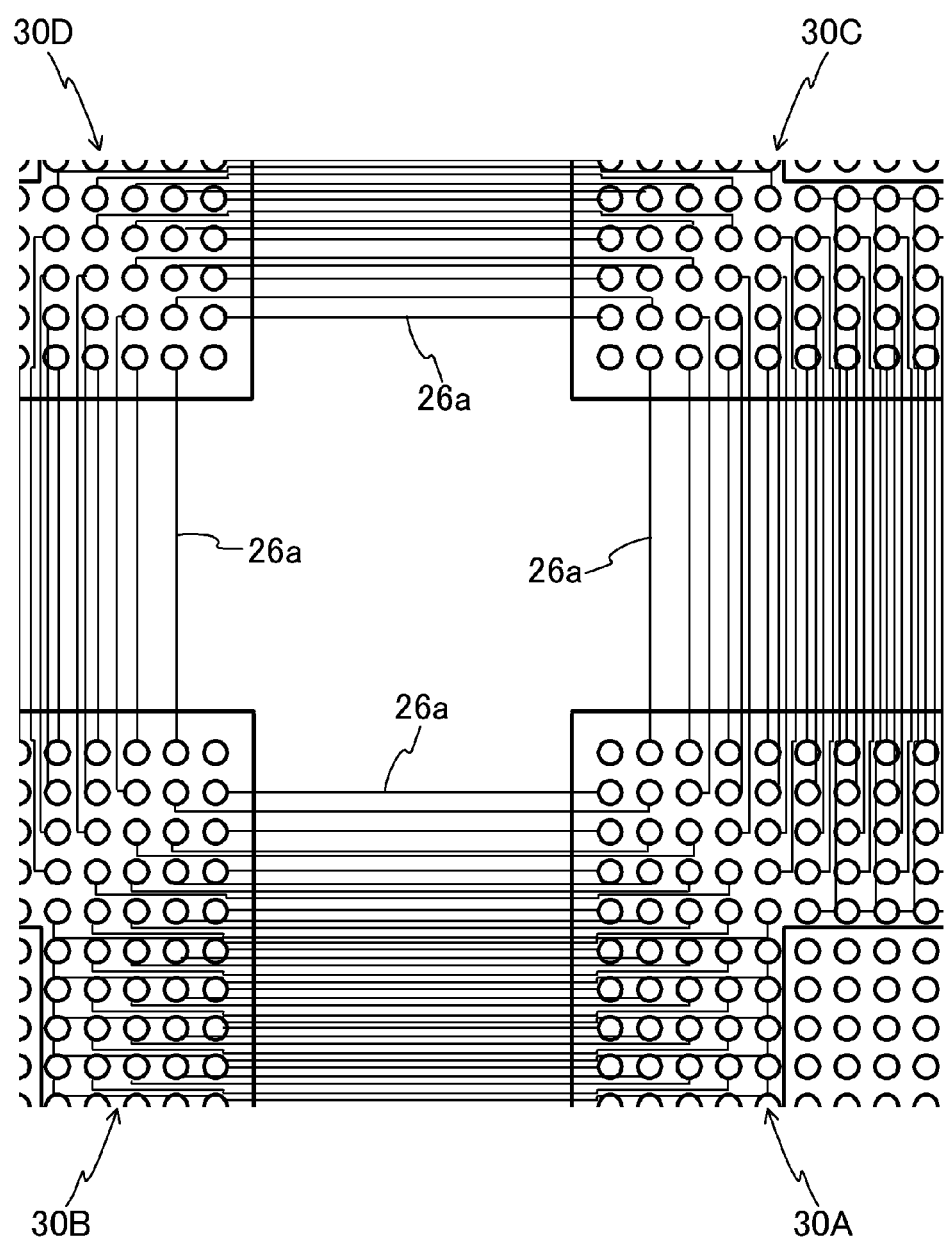
FIG. 4 is a view of schematically illustrating a connecting state of the LSI chips.

FIG. 4 schematically illustrates the connecting state between the LSI chips 30A to 30D. As illustrated in FIG. 4, the LSI chip 30A is connected with the LSI chips 30B and 30C via the wiring patterns 26a, and the LSI chip 30C are connected with the LSI chips 30A and 30D via the wiring patterns 26a. In this state, as illustrated in FIG. 4, one of the LSI chips 30A to 30D is connected with the others of the LSI chips 30A to 30D via the wiring patterns 26a at the area where all of the four chips are adjacent to each other. Additionally, as illustrated in FIG. 1, the clearance between the silicon interposer 20 and the LSI chips 30A to 30D are filled with resins 38.

FIGS. 5A to 5D illustrate signal transmission waveforms (voltage and current waveforms) of transmitting and receiving inverters, in a case where short wiring lengths are achieved in the silicon interposer 20 by use of the inverter provided within the chip and where the inverter provided within the chip is provided with one of four units included in a conventional ESD diode, the units including a single edion and a single ediop. In the case, signals can be transmitted with frequencies from about 3 GHz to about 4 GHz.

Figure 5A:
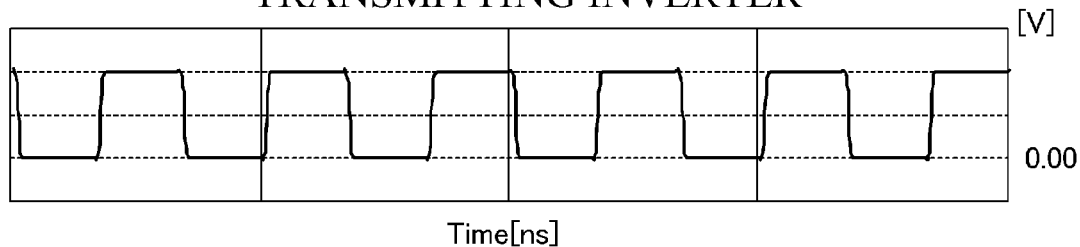
FIGS. 5A to 5D are views of illustrating signal transmission waveforms (voltage and current waveforms) of transmitting and receiving inverters.
Figure 5B:
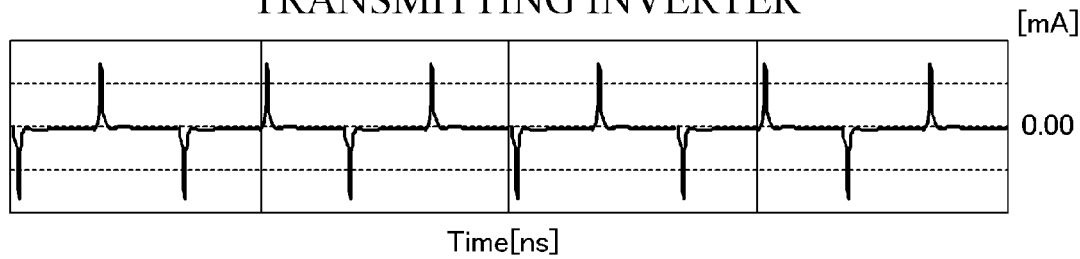
Figure 5C:
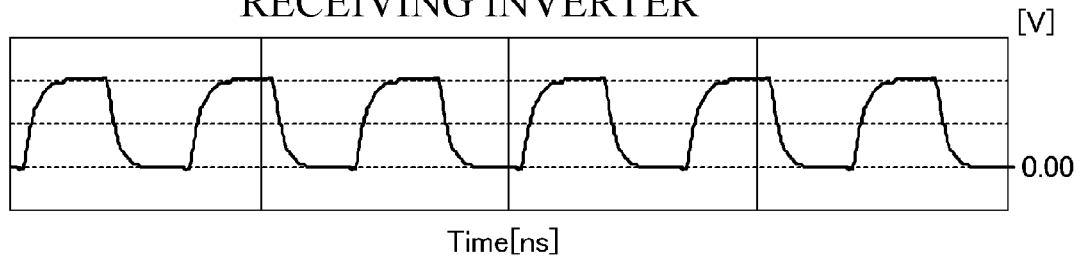
Figure 5D:
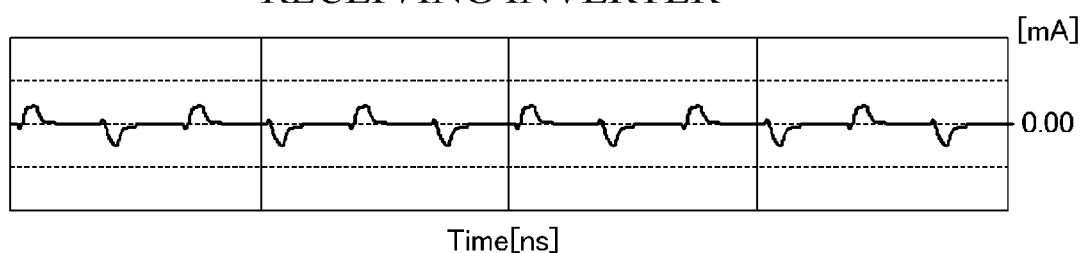
Figure 6:
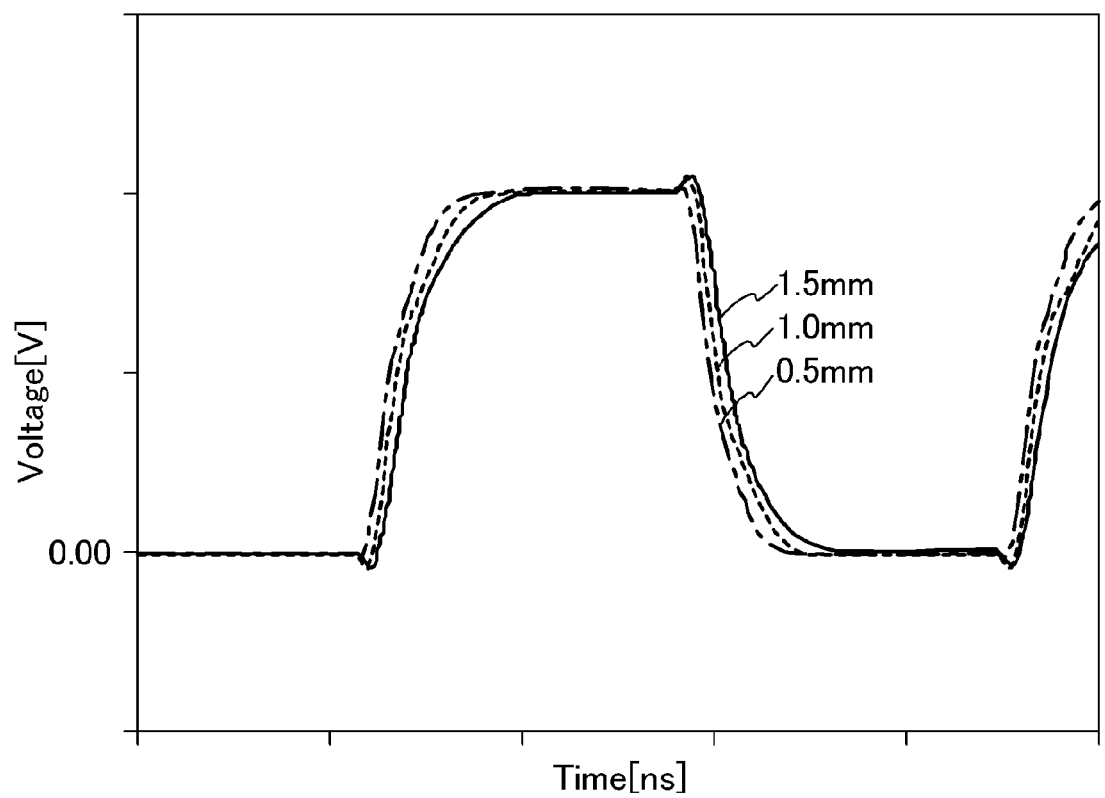
FIG. 6 is a view of illustrating the enlarged voltage waveform of the receiving inverter illustrated in FIG. 5C and enlarged voltage waveforms when the length of a wiring pattern is 0.5 mm and 1.0 mm.

FIG. 6 illustrates the enlarged voltage waveform of the receiving inverter illustrated in FIG. 5C. Also, FIG. 6 illustrates a voltage waveform of a dashed-dotted line when the length of the wiring pattern 26a is 0.5 mm, and a voltage waveform by a dashed line when the length of the wiring pattern 26a is 1.0 mm. FIG. 6 exhibits that the voltage waveform is substantially similar to the voltage waveform in the case where the length of the wiring pattern 26a is 1.5 mm, even when the length of the wiring pattern 26a is set to be 0.5 mm or 1.0 mm. That is, in the present embodiment, the signal transmission can be achieved with frequencies from about 3 GHz to about 4 GHz, in the case where the length of the wiring pattern 26a is set to be less than 1.5 mm, in addition to the case where the length of the wiring pattern 26a is set to be 1.5 mm.

Returning to FIG. 1, the heat spreader 50 is connected with the LSI chips 30A to 30D via a thermal injection material (TIM) 40. For example, the heat spreader 50 is made of a material such as copper, and has a function for radiating the heat generated in the LSI chips 30A to 30D.

In such a multi-chip module 100 as configured above, the silicon interposer 20 achieves the connection between the LSI chips and the connection between the LSI chips and the base board 10.

As mentioned above, in the present embodiment, the silicon interposer 20 disposed on the base board 10 has the wiring patterns 26a. One of the plural LSI chips 30A to 30D disposed on the silicon interposer 20 is connected with at least one of the others. Further, plural LSI chips and the base board 10 are electrically connected with each other via the portion (via hole) other than the wiring pattern 26a. With such arrangements, each of the LSI chips 30A to 30D are electrically connected with the base board 10 and one of the LSI chips 30A to 30D is electrically connected with the other LSI chips. In this case, the wiring patterns can be made to be fine patterns, because the silicon interposer 20 can be manufactured individually from the base board. In this way, the wiring pattern can be shortened and the wiring length between the LSI chips can be shortened. For this reason, the four LSI chips can be handled as a single pseudo large-sized LSI chip.

Further, the present embodiment does not have to secure a substantial channel area according to the wiring specification, so the wiring length between the chips can be shortened. Furthermore, by the shortening of the wiring length between the chips (for example, equal to or less than 1.5 mm), the high-speed transmission (from about 3 GHz to about 4 GHz) can be achieved. Moreover, the shortening of the wiring length allows the use of an LSI driver that has the same specifications of those in the LSI. Accordingly, the LSI itself can be downsized.

Additionally, in the present embodiment, a single pseudo large-sized LSI chip is achieved by the collection of the smaller chips. Thus, it is unnecessary to prepare semiconductor manufacture equipment, such as a high-performance semiconductor exposure apparatus which is used for the production of the large-sized LSI chip or a large mask. Accordingly, a multi-chip module with desired capabilities can be manufactured at low costs.

Since the wiring patterns 26a are formed by the semiconductor manufacture equipment in the present embodiment, the clearance between the wiring patterns 26a can be set smaller (for example, equal to or less than 1.5 mm). In this case, the manufacturing condition of the wiring between the chips can be substantially identical to that of the wiring within the chip, so this can efficiently suppress the decrease in the transmission efficiency between the LSI chips.

In the present embodiment, the LSI chips 30A to 30D are four chips disposed in a matrix manner, and all of four chips are connected with each other via the wiring patterns 26a at the area where all of the four chips are adjacent to each other. Thus, the LSI chips are efficiently connected with each other.

In the present embodiment, the wiring length between the LSI chips 30A and 30D can be set to be equal to or less than 1.5 mm. Therefore, the manufacturing condition of the wiring between the chips can be substantially identical to that of the wiring within the chip. This can suppress the decrease in the transmission efficiency between the LSI chips and this can reduce resistance value and power consumption.

The above embodiment has described a case where four LSI chips are provided. The embodiment is not limited to such a case. Any number of the LSI chips may be provided. The above embodiment has been described a case where one LSI chip is connected with the other two LSI chips as illustrated in FIG. 4. The embodiment is not limited to such a case. Any number of the LSI chips may be connected with one LSI.

The above embodiment has described the LSI chip as a chip. The embodiment is not limited to the LSI chip. Another type of chip may be employed. The above embodiment has described the silicon interposer as a wiring board. The embodiment is not limited to the silicon interposer. Another board other than the silicon board may be employed.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:
1. A multi-chip module comprising:
a board;
a wiring board disposed on the board and including a wiring pattern; and
a plurality of chips disposed on the wiring board,
wherein each of the plurality of chips is connected with at least one of the other chips, and the plurality of chips and the board are electrically connected with each other via a portion other than the wiring pattern of the wiring board, wherein each of the plurality of chips is electrically connected with at least one of the other chips via the wiring pattern, and wherein the wiring board is a silicon interposer, the silicon interposer including another board and an insulating layer disposed on the another board, the wiring pattern being formed in the insulating layer.

2. The multi-chip module of claim 1, wherein the wiring pattern is formed by semiconductor manufacture equipment.

3. The multi-chip module of claim 1, wherein a length of the wiring between the plurality of chips is equal to or less than 1.5 mm.

4. The multi-chip module of claim 1, wherein the plurality of the chips include four chips arranged in a matrix manner, and the each of chips is connected with at least one of the other chips via the wiring pattern at an area where all of the four chips are adjacent to each other.

5. The multi-chip module of claim 1, wherein the plurality of chips and the board are electrically connected with each other via via holes penetrating through the wiring board.

6. The multi-chip module of claim 5, wherein a clearance between the wiring patterns is smaller than a clearance between the via holes.

7. The multi-chip module of claim 1, wherein the plurality of chips are LSI chips.

8. The multi-chip module of claim 1, wherein the wiring pattern is formed in multiple layers of the insulating layer.

* * * * *